United States Patent [19]
Hornak et al.

[11] Patent Number: 5,974,306
[45] Date of Patent: Oct. 26, 1999

[54] TIME-SHARE I-Q MIXER SYSTEM WITH DISTRIBUTION SWITCH FEEDING IN-PHASE AND QUADRATURE POLARITY INVERTERS

[75] Inventors: Thomas Hornak, Portola Valley; Knud Knudsen, Menlo Park, both of Calif.

[73] Assignee: Hewlett-Packard Company, Palo Alto, Calif.

[21] Appl. No.: 08/908,995

[22] Filed: Aug. 8, 1997

Related U.S. Application Data

[63] Continuation-in-part of application No. 08/321,501, Oct. 12, 1994, Pat. No. 5,678,222.

[51] Int. Cl.$^6$ .................................................. H04B 1/16
[52] U.S. Cl. ........................ 455/323; 455/302; 375/332; 329/306; 327/113
[58] Field of Search ................................. 455/208, 209, 455/302, 318, 319, 313, 323; 375/280, 281, 323, 332; 329/306, 307; 327/113, 119, 124, 164, 172, 175

[56] References Cited

U.S. PATENT DOCUMENTS

| | | | |
|---|---|---|---|
| 3,614,627 | 10/1971 | Runyan | 455/207 |
| 3,984,777 | 10/1976 | Noguchi | 375/332 |
| 4,119,926 | 10/1978 | Frosch et al. | 331/1 A |
| 4,253,067 | 2/1981 | Caples et al. | 375/332 |
| 4,320,531 | 3/1982 | Dimon | 455/203 |
| 4,321,549 | 3/1982 | Hansen | 327/113 |
| 4,545,061 | 10/1985 | Hileman | 375/343 |
| 5,614,861 | 3/1997 | Harada | 375/332 |
| 5,678,222 | 10/1997 | Hornak et al. | 455/302 |

FOREIGN PATENT DOCUMENTS 2294169  10/1995  United Kingdom.

OTHER PUBLICATIONS

Nelson R. Sollenberger and Justin C–I Chuang, "Low–Overheard Symbol Timing and Carrier Recovery for TDMA Portable Radio Systems", *IEEE Transactions on Communications*, vol. 38, No. 10, Oct. 1990, pp. 1886–1892.

David I. Hoult, "A High–Accuracy I–Q Demodulator and Modulator", RF Design, Mar., 1997, pertinent pp. 26, 30, 34, and 38.

Jan Crois and Michael Steyaert, "A Fully Integrated 900 MHz CMOS Double Quadrature Downconverter", 1995 IEEE International Solid–State Circuits Conference, Digest of Technical Papers pp. 136–137, and Slide Supplement pp. 100–101.

*Primary Examiner*—Edward F. Urban

[57] ABSTRACT

An image-rejecting receiver comprises a tunable mixer stage, a time-share I-Q mixer stage, a complex filter, and an image rejector. The time-share I-Q mixer stage includes a switch assembly, inphase and quadrature polarity inverters, and a clock generator. The switch assembly generates pulses and distributes them in alternation to the polarity inverters. Performing distribution prior to polarity inversion preserves the orthogonality of the inphase and quadrature target signal components despite pulse-to-pulse bleeding. Charge accumulated at the distributor switch input is dumped between pulses to further minimize such bleeding. A current-mode field-effect-transistor implementation ensures unity gain across each polarity inverter so that they are gain-matched. Gain matching and preservation of orthogonality optimize the conditions for the complex filter to attenuate and for the image rejector to cancel an image signal. The polarity inverters are switched in quadrature to relax polarity-inverter transition timing tolerances, decreasing costs and increasing reliability.

12 Claims, 4 Drawing Sheets

TIME-SHARE I-Q MIXER SYSTEM WITH DISTRIBUTION SWITCH FEEDING IN-PHASE AND QUADRATURE POLARITY INVERTERS

This is a continuation-in-part of allowed U.S. patent application Ser. No. 08/321,501, filed Oct. 12, 1994, now U.S. Pat. No. 5,678,222.

BACKGROUND OF THE INVENTION

The present invention relates to analog signal processing and, more particularly, to signal processing in which inphase and quadrature signal components are generated. A major objective of the present invention is to provide an integrated circuit receiver for radio-frequency communications with improved image rejection.

A classical radio communications system includes a transmitter and a receiver. The transmitter modulates the amplitude, frequency, and/or phase of a carrier signal with a signal bearing information (e.g., sound, video, and data) to yield a modulated carrier signal. The receiver receives and demodulates the modulated carrier signal to extract the information-bearing signal.

Typically, a receiver receives not only a desired modulated carrier signal, but also other modulated carrier signals spanning a crowded frequency spectrum. A challenge of such a receiver is to select, i.e., "tune in", a "target" carrier signal while rejecting unwanted signals.

To take advantage of more economical low-frequency components, a received signal is typically converted to a low frequency prior to demodulation. A "heterodyne" receiver typically includes a mixer and a local oscillator. The oscillator outputs a constant-frequency waveform; the oscillator frequency can be adjusted to "tune in" targets with different carrier frequencies. The mixer mixes the incoming signal with the oscillator waveform to yield a difference signal (or, more rarely, a sum signal). The difference signal includes a frequency-converted target signal that bears the same modulation as the as-received target signal; the carrier frequency of the converted target signal is the difference between the carrier frequency of the as-received target signal and the oscillator frequency. Thus, if a received signal having an 805 MHz carrier frequency is mixed with an 800 MHz oscillator waveform, a signal with a 5 MHz carrier frequency results. Thus, the 5 MHz signal can be demodulated instead of the 805 MHz signal.

Typically, unwanted signals that are also received are similarly frequency shifted. Assuming proper bandwidth allocations, these unwanted signals can be distinguished by frequency. Suitable bandpass filters can be used to reject most of the unwanted signals either before or after frequency conversion.

Special consideration must be given to image signals that are converted by mixer stages to carrier frequencies of the same magnitude as the target signal. In the above example, an image signal with an as-received carrier frequency of 795 MHz is converted to a carrier frequency of −5 MHz. Most signal processing devices do not distinguish frequencies by sign, so it can be difficult to remove the −5 MHz image signal from the 5 MHz target signal.

Where the as-received carrier frequencies of the target and image signals are sufficiently different, bandpass filtering can remove the image signal before mixing. Thus, the undesired image signal is not generated at the mixer output. However, it can be impractical to bandpass filter an as-received image signal having a carrier frequency close to that of the target signal. For example, it is typically impractical to bandpass filter out a 795 MHz image signal from an 805 MHz target signal.

Complex filters, also known as "vector" or "polyphase" filters, are known that can reject image signals in favor of target signals. Such a filter has been disclosed in "A Fully Integrated 900 MHz CMOS Double Quadrature Downconverter" by Jan Crols and Michiel Steyaert (ISSCC Digest of Technical Papers and Slide Supplement, Feb. 16, 1995, pp. 100–101, 136–137). Each output of a complex filter is a function of two filter inputs; this function takes into account the phase relationship between the two inputs.

For example, a complex filter can pass a signal in which the inphase component leads the quadrature component while attenuating a signal with the same frequency in which the inphase component lags the quadrature component. If the inputs to such a complex filter are the inphase and quadrature components of a target signal in which the inphase component leads, the filter attenuates the image signal because, in the image signal, the inphase component lags.

While a complex filter can provide sufficient image attenuation in cases where the target signal strength is at least comparable to the image signal strength, there are important applications where this condition does not hold. This is especially the case in mobile receiver applications, where, for example due to an unfavorable difference in transmitter proximity, an image signal can be 60 dB stronger than the target signal. In such cases, image rejection can be achieved using a multistage complex filter, but such a solution is expensive.

More economically, the image signal can be rejected by total cancellation instead of filtering. With the inphase and quadrature components (whether filtered or unfiltered) of the mixer output separated, one of the components can be shifted by one-quarter cycle so that the target signal components add constructively and the image components cancel. If, for example, the inphase component of the target signal leads the quadrature component by one-quarter cycle, the former can be delayed by one-quarter cycle to time-align it with the target quadrature component. When summed, the time-aligned target components add constructively. In the same example, the inphase component of the image signal lags its quadrature component. Delaying the inphase component of the image signal places it in an anti-phase relationship with the quadrature component of the image signal; upon summation, the inphase and quadrature components cancel. Thus, the image signal can be rejected in favor of the target signal.

Generation of the inphase and quadrature components is conventionally performed using two mixers driven in quadrature by the same oscillator. The effectiveness of the image rejection, whether performed by a complex filter, an image rejector, or both, depends on several factors, including the equality of the mixer gains and orthogonality of the inphase and quadrature components. In practice, it is difficult to obtain gain equality between signal mixers. Accordingly, image rejection effectiveness has been limited in systems using conventional mixers.

Parent U.S. patent application Ser. No. 08/321,501, the subject matter of which has been published as Great Britain Patent Application GB 2,294,169, discloses several time-share mixers used in both I-Q demodulators and image-rejecting receivers. In I-Q demodulator embodiments, an input signal, which can be the output of a first mixer stage, is divided into quarter cycle segments corresponding to respective phases of the input signal. The segments include in succession, for example, inphase segments, quadrature segments, inverse-phase segments, and inverse-quadrature segments. (Alternatively, depending on the modulator, the order of the segments can be quadrature, inphase, inverse quadrature, and inverse phase.)

A polarity inverter can be used to invert every other pair of segments so that the inverse-phase segments become inphase segments and the inverse-quadrature segments can become quadrature segments. To this end, the polarity inverter is switched at the frequency of the input signal. The polarity inverter can be inserted at either the signal input, the oscillator input, or the output of the first stage mixer. The result of mixing and polarity inversion is a signal with alternating inphase and quadrature segments.

A distribution switch, operating at twice the rate of the input signal, routes the inphase segments along an "inphase" path and the quadrature segments along a "quadrature" path. This yields the desired separation of inphase and quadrature signal components. The components are in the form of pulses instead of being continuous. However, any filtering used to eliminate unwanted signal frequencies will also eliminate the harmonics associated with the pulse characteristics of the components. In other words, filtering the inphase and quadrature pulse trains yields continuous inphase and quadrature component signals. Thus, the combination of a polarity inverter and a distribution switch can serve as a mixer stage that generates inphase and quadrature components.

In the image-rejecting receiver embodiments, operation is similar. However, in these embodiments, the polarity inverter frequency is offset from the signal frequency by the output frequency of the polarity inverter. Where the polarity inverter output frequency is non zero, the phases of the input signal segments defined by the polarity inverter are not strictly commensurate with quarter-cycle segments of the input signal; there is a disparity due to the frequency offset. However, since in practice the disparity is small and since the distribution switch is switching the segments into "inphase" and "quadrature" signal paths, the terms "inphase", "quadrature", "inverse phase", and "inverse quadrature" are used here and below to distinguish the successive segments, as they are in the I-Q demodulator case.

It can be difficult to ensure that the duration for which the distribution switch distributes the signal along the inphase path exactly matches the duration for which the distribution switch distributes the signal along the quadrature path. If these durations are not matched, the time-averaged gain along the paths will differ. If the time-averaged gains differ, image rejection suffers.

Accordingly, a duty-cycle equalizer switch can be placed upstream of the distribution switch. The duty-cycle equalizer switch alternatively directs and diverts the input signal to and from the distribution switch input. Thus, what reaches the distribution switch is not a continuous signal, but a pulse train of uniformly spaced pulses of equal duration. The switch timings are such that the pulses alternate between "inphase" pulses and "quadrature" pulses. The inphase pulses are segments of the inphase component of the target signal, while the quadrature pulses are segments of the quadrature phase of the target signal.

The distribution switch directs the inphase pulses along an inphase path to define an inphase pulse train; the distribution switch directs the quadrature pulses along a quadrature path to define a quadrature pulse train. The bandpass filtering used to remove unwanted frequencies also serves to smooth the pulses into continuous inphase and quadrature component signals. These can be processed by a complex filter or an image rejector to provide relatively effective image rejection while avoiding the gain matching problems afflicting mixer stage employing nominally matched mixers.

The time-share I-Q mixer with duty-cycle equalization provides for definite improvements in image rejection. However, as this new performance plateau has been achieved, sights are being set on even more effective image rejection.

SUMMARY OF THE INVENTION

In the course of the present invention, limitations in the disclosed time-share I-Q mixers were identified. In particular, parasitic capacitance at the input of the distribution switch causes bleeding from pulse to pulse. For example, in the embodiment of FIG. 12 of the parent application, some of the signal associated with an inphase pulse remains "captured" by the parasitic capacitance and then transferred to the succeeding quadrature pulse. In turn, signal associated with the quadrature pulse is captured by the parasitic capacitance and transferred to the next inphase pulse. Thus, the inphase and the quadrature pulse streams bleed into each other so that their orthogonality is impaired. This loss of orthogonality limits image rejection.

The first step of the invention is to discharge the parasitic capacitance while the input signal is diverted from the distribution switch input. This reduces the impairment of orthogonality. However, it is impractical to discharge the parasitic capacitance entirely. Accordingly, the present invention strives to prevent the parasitic capacitance from affecting the orthogonality of the inphase and quadrature components.

The impairment of orthogonality can be limited, in part, by not inverting polarity upstream of the distribution switch. In that case, the pulse train received by the distribution switch comprises repeating patterns of an inphase pulse, followed by a quadrature pulse, followed by an inverse-phase pulse, and followed by an inverse-quadrature pulse. As in prior time-share I-Q mixers, the inverse-phase pulse bleeds into the succeeding quadrature pulse. However, the succeeding pulse into which the quadrature pulse bleeds is an inverse-phase pulse instead of an inphase pulse. The inverse-phase pulse bleeds into the following inverse-quadrature pulse. The overall effect of the bleeding is that the I coordinate and the Q coordinate are rotated equally so that orthogonality of the coordinates is preserved. Thus, the performance of an image attenuator, e.g., a complex filter, an image rejector, or both, is not impaired.

Since there is no upstream polarity inversion, the distribution switch distributes both inphase and inverse-phase pulses along the inphase path, and distributes both quadrature and inverse-quadrature pulses along the quadrature path. Thus, polarity inverters are required along the inphase and quadrature paths to yield the desired inphase and quadrature components.

It is necessary to ensure that the parallel polarity inverters do not reintroduce the gain mismatch associated with the previously eliminated inphase and quadrature mixers. To this end, the polarity inverters can operate in current mode through field-effect transistors. This can ensure that each polarity inverter provides unity gain, so that the gains are equal.

A clock generator generates clock signals to drive these time-share mixer components. The polarity inverters are driven at an inversion frequency. The distribution switch is driven at twice the inversion frequency. The duty-cycle equalization switch is driven at four times the inversion frequency, i.e., at twice the rate of the distribution switch.

The distribution switch transitions while the duty-cycle equalization switch is diverting or decoupling the input signal from the distribution switch. Likewise, the polarity inverters can be switched while the duty-cycle equalization switch is diverting or decoupling. This is a requirement where the polarity inverters are switched in unison.

In accordance with a further aspect of the present invention, the polarity inverters are not switched in unison. Removing the unison constraint greatly relaxes the timing tolerances for polarity inverter transitions. Transitions of the inphase polarity inverter can be executed while no pulse is present at the inphase polarity inverter. Each interval between pulses presented to the inphase polarity inverter includes in succession: 1) a first segment during which no pulses are present at the distribution switch, 2) a second segment in which the distribution switch is directing a quadrature or inverse-quadrature pulse to the quadrature polarity inverter; and 3) a third segment in which no pulses are present at the distribution switch. An interval of like duration between pulses presented to the quadrature polarity inverter is available for switching the quadrature polarity inverter.

To take full advantage of these extended transition intervals, the polarity inverters must be switched at different times. Optimally, the polarity inverters can be switched exactly one-quarter cycle out of phase. However, due to the relaxed timing tolerances, the phase between the polarity inverter transitions can vary. More generally, the invention requires that the polarity inverters be switched "in quadrature", which, herein, means that the phase between the inphase and quadrature polarity inverter transitions is closer to quadrature (90°) or inverse quadrature (−90°) than it is to inphase (0°) or inverse phase (180°).

When the polarity inverters are switched exactly one-quarter cycle out of phase, the timing window available for the timing and duration of the polarity-inverter transition is roughly three times what it is in cases where the polarity inverters are switched in unison. The greater transition tolerances reduce demands on timing and transition slew rates. These relaxed tolerances in turn simplify design, and decrease chip costs and power requirements.

In accordance with the foregoing, the present invention provides for improved image rejection by reducing parasitic charge bleeding at the distribution switch input and by preventing any remaining parasitic bleeding from impairing I-Q orthogonality. This is achieved by moving the polarity inversion function downstream of the distribution switch. Gain matching of the polarity inverters is achieved by using a current mode signal and by forcing each polarity inverter to have unity gain through field-effect-transistor implementation. Lower chip costs and power requirements are attained by driving the polarity inverters in quadrature. These and other features and advantages of the invention are apparent from the description below with reference to the following drawings.

DESCRIPTION OF THE PREFERRED EMBODIMENTS

Figure 1:
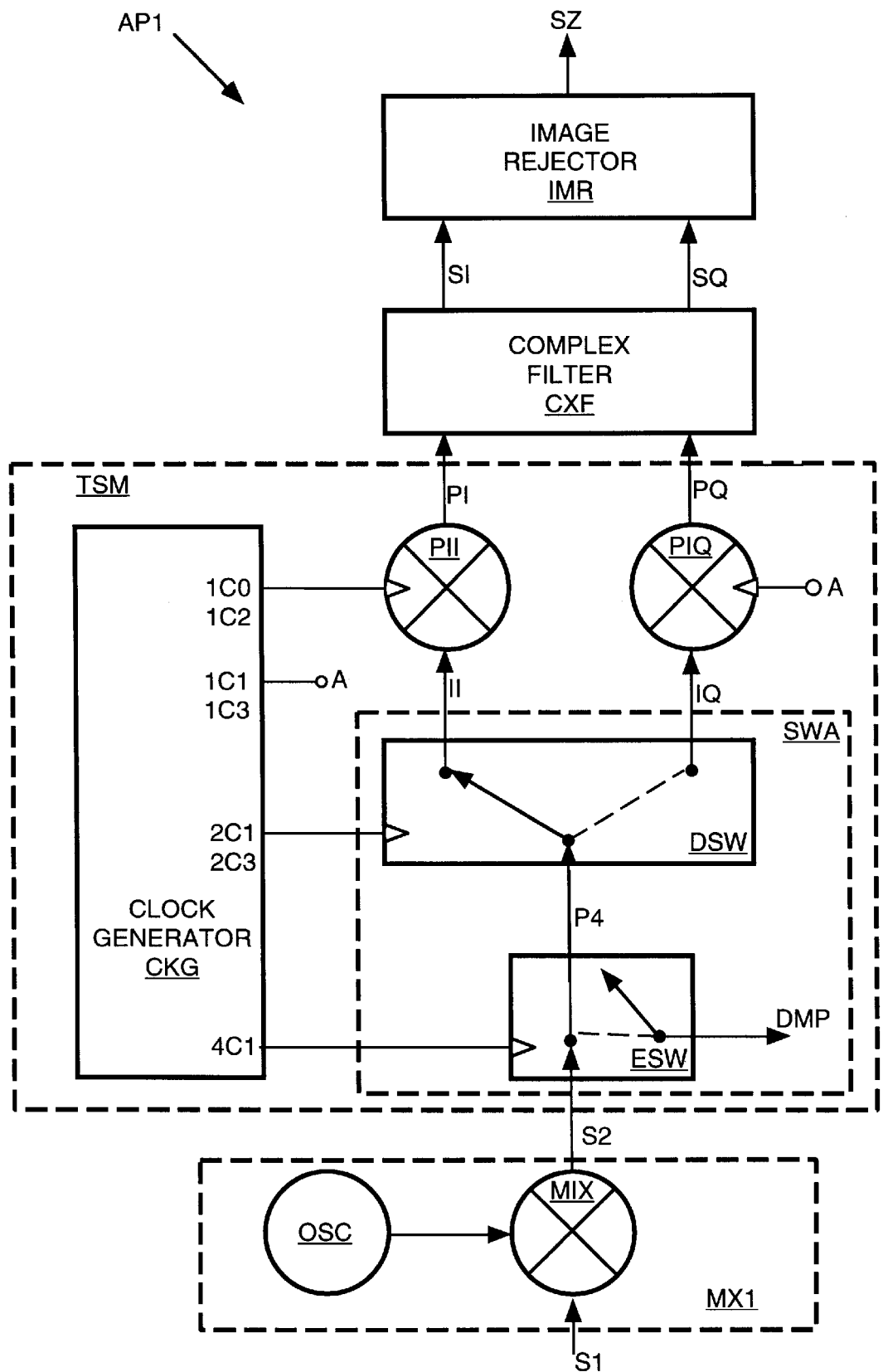
FIG. 1 is a block diagram of an analog signal processing system incorporating a time-share I-Q mixer stage in accordance with the present invention.

In accordance with the present invention, an analog signal processing system AP1 comprises a conventional mixer stage MX1, a time-share I-Q mixer stage TSM, a complex filter CXF, and an image rejector IMR. Mixer stage MX1 includes a mixer MIX and a local oscillator OSC. System AP1 can serve as a receiver front end; tuning can be affected by adjusting the frequency of oscillator OSC. Time-share I-Q mixer stage TSM comprises a switch assembly SWA, an "inphase" polarity inverter PII, a "quadrature" polarity inverter PIQ, and a clock generator CKG.

System AP1 receives an input signal S1, which is the input to first mixer stage MX1. Signal S1 is a superposition of many different signals, each with a respective frequency and signal strength. For purposes herein, it can be assumed that the target signal, for which reception is desired, has an "as-transmitted" carrier frequency of 2205 MHz.

To the end of receiving the 2205 MHz signal, oscillator OSC is set to a frequency of 2000 MHz. Mixer MIX mixes signal S1 with the oscillator waveform to yield signal S2. The mixing converts each received carrier to a frequency 2000 MHz below its "as-transmitted" frequency; the carrier frequency of the target signal is converted to 205 MHz.

Mixer MIX would convert an image signal having an "as-transmitted" carrier frequency of 1795 MHz to a negative intermediate frequency of −205 MHz. However, the 1795 MHz signal is filtered out upstream of mixer MIX, and so is excluded from signal S1 and no image signal results.

Thus, signal S2 is a broadband signal including a target signal with a carrier frequency of 205 MHz. Signal S2 is input as a time-varying differential current to a switch assembly SWA of time-share I-Q mixer stage TSM. The purpose of switch assembly SWA is to generate and distribute pulses with four phases—inphase, quadrature, inverse-phase, and inverse-quadrature. This can be achieved using a single switch, but with potential problems in equalizing the distribution duty cycle.

Accordingly, switch assembly SWA includes a duty-cycle equalizer switch ESW and a distribution switch DSW. Signal S2 is provided to equalizer switch ESW. In its "pass" position (indicated by a solid line in FIG. 1), equalizer switch ESW permits input signal S2 to reach distribution switch DSW. When in its "dump" position (shown by a dashed line in FIG. 1), equalizer switch ESW diverts current-mode signal S2 to a current dump DMP. In effect, signal S2 is converted to a pulse train P4, which is the input to distribution switch DSW.

Rather than decoupling signal S2 from the input of distribution switch DSW, ESW diverts signal S2 along a low impedance path to current dump DMP. Thus, as the current is being dumped, charge (accumulated in the parasitic capacitance at the input of distribution switch DSW) is also dumped. This minimizes I-Q bleeding and crosstalk. Even without the location of the polarity inverters downstream of the distribution switch, this discharge of parasitic capacitance would help maintain I-Q orthogonality and, thus, contribute to effective image rejection.

Equalization switch ESW is operated at an 800 MHz rate, about four times per cycle of the target signal carrier frequency of 205 MHz. Approximately four pulses are generated per target signal cycle. If the lead pulse of a four-pulse series represents an inphase component of the target signal, the following pulse is a segment of a quadrature phase component, the third pulse is a segment of an inverse-phase component, and the fourth pulse is a segment of an inverse-quadrature phase component. Thus, four-phase pulse train P4 takes the form Q*, I*, Q, I, Q*, I*, Q, I, where the right-most pulse is the earliest in time.

To the extent parasitic capacitance at the input of distribution switch DSW causes each pulse to bleed into the next: inphase pulses bleed into quadrature pulses (Q←I); quadrature pulses bleed into inverse-phase pulses (I*←Q); inverse-phase pulses bleed into inverse-quadrature pulses (I*←Q*); and inverse-quadrature pulses bleed into inphase pulses (I←Q*). This bleeding results in an equal rotation of I and Q coordinates, but not in an impairment of their orthogonality. Thus, subsequent image rejection is not impaired.

Distribution switch DSW distributes these pulses in alternation to inphase polarity inverter PII and to quadrature polarity inverter PIQ. To this end, distribution switch DSW is switched at 400 MHz, half the rate of equalizer switch ESW. The distribution switch transitions are timed so that they are executed while equalizer switch ESW is preventing signal S2 from reaching distribution switch DSW so that pulses are left intact, i.e., not influenced by the transition timing.

As a result of the distribution, the I and I* pulses are distributed to inphase polarity inverter PII, and the Q and Q* pulses are distributed to quadrature polarity inverter PIQ. Thus, the input to inphase polarity inverter PII is an alternating "inphase" pulse train II with the form I*, I, I*, I; likewise, the input to quadrature polarity inverter PIQ is an alternating "quadrature" pulse train IQ with the form Q*, Q, Q*, Q.

The purpose of polarity inverters PII and PIQ is to convert the received alternating pulse trains II and IQ to nonalternating pulse trains PI and PQ. To this end, polarity inverters PII and PIQ are switched at 200 MHz, half the rate of distribution switch DSW; polarity inverter transitions occur between received pulses so that pulses remain intact. In one embodiment of the invention, the inverters are switched in unison, in which case the transitions must be effected while equalization switch ESW is dumping signal S2.

In preferred time-share I-Q mixer stage TSM, polarity inverters PII and PIQ are switched in quadrature. In other words, the transitions of quadrature polarity inverter PIQ lag the transitions of inphase polarity inverter PII by about one-quarter cycle at the 200 MHz rate at which they are switched. (In the case the pulse order is reversed, the quadrature polarity inverter would lead rather than lag by one-quarter cycle.) Pulse integrity can be maintained if a polarity inverter is switched either while equalization switch ESW is dumping signal S2, or while distribution switch DSW is distributing a pulse to the other polarity inverter. Switching the polarity inverters in quadrature instead of in unison approximately triples the duration of the time window available for polarity inverter transitions. The relaxed timing constraints simplify system design, reduce chip costs and power requirements.

Inphase polarity inverter PII inverts (I*→I) incoming inverse-phase pulses, while leaving incoming inphase pulses uninverted (I→I). As a result, the output of inphase polarity inverter PII is an inphase pulse train PI of the form I, I, I, I, (considering only target signal components). Likewise, quadrature polarity inverter PIQ inverts (Q*→Q) incoming inverse-quadrature, while leaving quadrature pulses uninverted (Q→Q). As a result, the output of quadrature polarity inverter PIQ is a quadrature pulse train PQ of the form Q, Q, Q, Q. Pulse trains PI and PQ are the outputs of time-share I-Q mixer TSM.

Pulse trains PI and PQ respectively contain the desired inphase and quadrature components of the target signal, with its carrier frequency shifted to 5 MHz. Of course, other carrier frequencies represented in signal S2 are represented in the pulse train, although there is no simple correspondence between pulses and phases. The pulse trains also contain inphase and quadrature components of an image signal with a carrier frequency of −5 MHz. This corresponds to a 195 MHz image carrier in signal S2. Subsequent filtering and image rejection isolates the target signal from the unwanted signals.

To this end, complex filter CXF passes the 5 MHz components of the pulse trains to the relative exclusion of neighboring frequencies (e.g., above 6 MHz and below 4 MHz), especially negative frequencies including the −5 MHz image carrier frequency. Thus, complex filter CXF provides for partial rejection of unwanted frequencies. The filtering also removes the harmonics associated with the pulse form of pulse trains PI and PQ. Thus, the outputs of complex filter CXF are a smoothed inphase signal SI and a smoothed quadrature signal SQ.

More complete rejection is provided by image rejector IMR, which functions as a notch filter for the −5 MHz frequency of the image signal. Image rejector IMR includes a phase shifter time-aligning inphase signal SI with quadrature signal SQ by means of a quarter-cycle relative phase shift; the same shift places the inphase and quadrature components of the image signal in an anti-phase relationship. Upon summation, the inphase target components add constructively, while the anti-phase image components cancel. Thus, the image signal is rejected.

For example, in the case that the inphase component of the target signal leads the quadrature component by one-quarter cycle, the phase shifter can delay the inphase component one-quarter cycle; this time aligns the target components. In this example, the inphase component of the image signal lags its quadrature component. Thus, the delay puts the image signal components in an anti-phase relationship. As indicated above, upon summation, the image signal is canceled in favor of the target signal.

The rejection is effective since, in part due to the action of the duty-cycle equalizer, gains along the inphase and quadrature paths are matched. Furthermore, placing the polarity inverters downstream of the distribution switch maintains the orthogonality of the inphase and quadrature components. Of course, it is necessary to match the delays introduced by the inphase and quadrature signal paths as well. Matching gains and delays, and maintaining orthogonality, all contribute to effective image attenuation by complex filter CXF and rejection by image rejector IMR.

Figure 2:
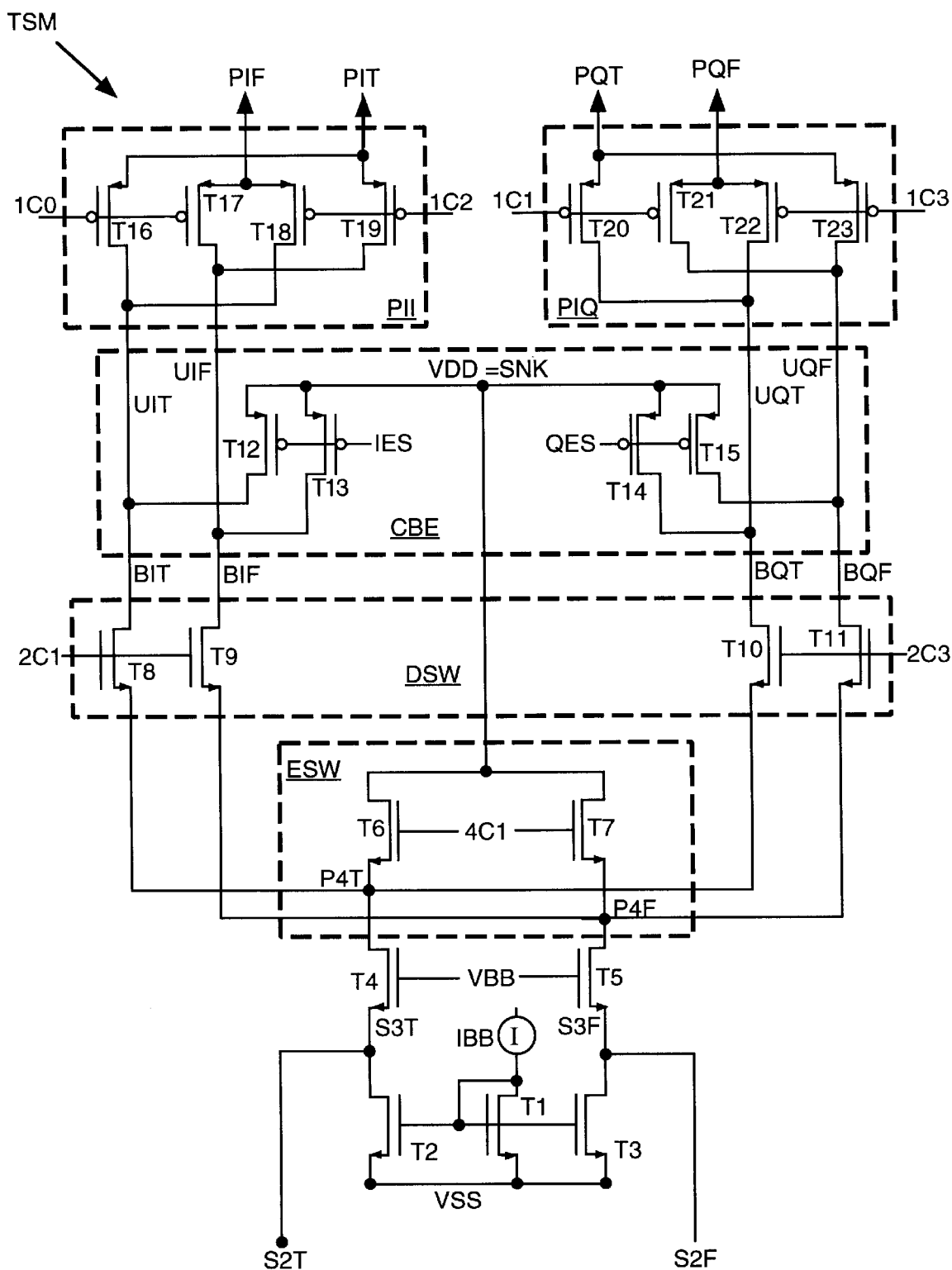
FIG. 2 is a transistor-level diagram of the time-share I-Q mixer stage of FIG. 1.

Time-share I-Q mixer TSM operates in differential current mode throughout. Mixer MIX provides input S2 to I-Q time-share mixer TSM in the form of the difference between a "true" signal S2T and a "false" signal S2F, as shown in FIG. 2. Herein, the terms "true" and "false" are used to distinguish signals that vary in opposing directions (and indicate nothing about existence or veracity of the signals). Signal flow is in the direction of the electron current, from bottom to top in FIG. 2.

Time-share mixer TSM comprises n-type MOSFET transistors T1–T11 and p-type MOSFET transistors T12–T23, as shown in FIG. 2. Transistor T1 and current source IBB provide a bias voltage offset above VSS (VSS=0 volts) to the gates of transistors T2 and T3. Transistors T2 and T3 thus act respectively as sources of constant bias currents for the true and false signal paths of time-share I-Q mixer TSM. These bias currents, which are of the same direction and magnitude, are added to the input signals so that the resulting currents are always positive, although with amplitudes varying in a complementary mode. Thus, the sum of true input signal S2T and the bias current is a biased true signal S3T; likewise, the sum of false input signal S2F and the bias current is a biased false signal S3F.

Transistors T4 and T5 serve as "cascode" transistors. Each of these transistors T4, T5 has its gate coupled to a constant voltage VBB, and its source coupled to biased input signal S3T and S3F. As a result, the currents through cascode transistors T4 and T5 are S3T and S3F, respectively. Duty-cycle equalizer switch ESW comprises transistors T6 and T7. The gates are driven by 800 MHz clock 4C1, which swings from zero volts to VDD. Clock 4C1 turns transistors T6 and T7 on and off at its 800 MHz rate. Transistors T6 and T7 have their drains coupled to VDD and their sources coupled to respective cascode transistors T4 and T5. In the illustrated embodiment, VDD=3.0 volts and VBB=2.0 volts. When transistors T6 and T7 are on, their electron currents are dumped to VDD, which thus serves as a current dump DMP for input currents S2T and S2F. When transistors T6 and T7 are off, cascode currents S3T and S3F are passed to distribution switch DSW.

The effect of duty-cycle equalizer switch ESW is to decimate the continuous true and false signals S3T and S3F to generate true and false four-phase pulse trains P4T and P4F (the complementary components of pulse train P4 in FIG. 1). Pulses of pulse train P4T are successively segments of Q*, I*, Q, I (time advances from right to left) components of the target signal, while the pulses of pulse train P4F are successively segments of Q, I, Q*, I* target signal components. This is because the false version of true I is the same as the true version of I*, and vice versa. The same relationship applies for the quadrature component.

Distribution switch DSW comprises transistors T8–T11. Transistors T8 and T9 are driven by 400 MHz clock 2C1 so that they pass only pulses I and I* of respectively received pulse trains P4T and P4F. Transistors T10 and T11 are driven by 400 MHz clock 2C3, which is the complement of clock 2C1. Thus, transistors T10 and T11 pass only the Q and Q* pulses of respectively received pulse trains P4T and P4F. Thus, transistor T8 provides an alternating (I, I*, I, I*, etc.) biased "true" inphase pulse train BIT, transistor T9 provides an alternating biased "false" inphase pulse train BIF, transistor T10 provides an alternating biased "true" quadrature pulse train BQT, and transistor T11 provides an alternating biased "false" quadrature pulse train BQF.

Transistors T12–T15 constitute a current bias eliminator CBE, the purpose of which is to remove any constant-current (DC) bias that would be input to polarity inverters PII and PIQ. Otherwise, the voltage drop across the polarity inverters would be larger than needed, decreasing the voltage available to transistors T2–T5 and T8–T11 feeding the polarity inverters. Each transistor T12–T15 has its source coupled to VDD and its drain coupled to a respective alternating signal BIT, BIF, BQT, BQF.

Transistors T12 and T13 are driven by a common inphase error signal IES, while transistors T14 and T14 are driven by a common quadrature error signal QES. Error signals IES and QES correlate with any constant-current bias. The bigger the bias, the greater the amount of current dumped to VDD. Alternatively, because the constant current bias in the I path and the Q path are essentially the same, a common error signal can be used to drive the current bias eliminator transistors. After current bias eliminator CBE removes the bias, alternating signals BIT, BIF, BQT, and BQF, respectively become an alternating unbiased true inphase pulse train UIT, an alternating unbiased false inphase pulse train UIF, an alternating unbiased true quadrature pulse train UQT, and an alternating unbiased false quadrature pulse train UQF.

Inphase polarity inverter PII comprises transistors T16–T19. Transistors T16 and T18 receive alternating unbiased true inphase pulse train UIT, which has the form I*, I, I*, I. Transistor T16 is driven by 200 MHz clock 1C0 so that it passes only the I pulses of pulse train UIT; transistor T18 is driven by clock 1C2, the complement to clock 1C0, so that transistor T18 passes only the I* pulses of pulse train UIT. Likewise, transistor T19 passes only the I pulses of pulse train UIF, and transistor T17 passes only the I* pulses of pulse train UIF. The I pulses passed by transistors T16 and T19 are "interleaved" to define a nonalternating true inphase pulse train PIT, while the I* pulses passed by transistors T17 and T18 are interleaved to define a nonalternating false inphase pulse train PIF. Pulse trains PIT and PIF of FIG. 2 are the differential (true and false) versions of pulse train PI in FIG. 1.

Quadrature polarity inverter PIQ comprises transistors T20–T23. The structure and operation of quadrature polarity inverter PIQ is essentially identical to that of quadrature polarity inverter PII. However, it is driven by clocks 1C1 and its complement 1C3, which have respective quadrature relationships with clocks 1C0 and 1C2. Accordingly, transistors T20–T23 pass only Q and Q* pulses of the received alternating unbiased true quadrature pulse train UQT and alternating unbiased false quadrature pulse train UQF.

Interleaving of the passed pulses yields nonalternating true quadrature pulse train PQT and nonalternating false quadrature pulse train PQF at the differential outputs of quadrature polarity inverter PIQ. Pulse trains PQT and PQF are the differential versions of pulse train PQ shown in FIG. 1. Nonalternating outputs PIT, PIF, QIT, and QIF constitute the differential inphase and quadrature pulse train outputs of time-share mixer TSM.

Figure 3:
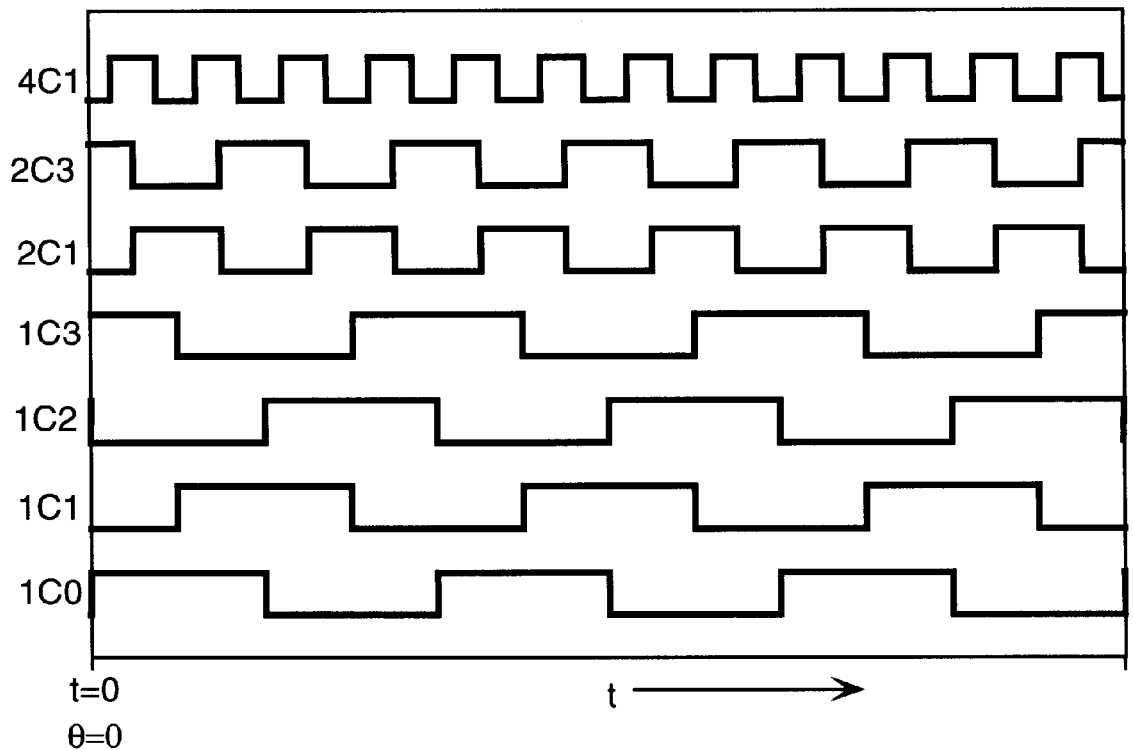
FIG. 3 is a timing chart of clocks generated to drive components of the time-share I-Q mixer stage of FIG. 2. The leading number of a clock identifier indicates the clock rate as a multiple of the clock rate used to drive the polarity inverters. The trailing number of the clock identifier indicates the phase of the clock relative to a time t=0 indicated in FIG. 3. For example, clock 2C3 has a rate two times that of clock 1C0 and undergoes its first upward transition three-quarter cycles after t=0.

These time-share I-Q mixer outputs are filtered by complex filter CXF and image rejector IMR, shown in FIG. 1. In addition, differential outputs PIT and PIF can be filtered and summed to yield error signal IES; likewise, differential outputs PQT and PQF can be summed to yield error signal QES. As described above, current bias eliminator CBE uses these error signals to minimize the time-averaged constant current bias in polarity inverters PII and PIQ. The operation of time-share mixer TSM is further explained with reference to the timing diagram of FIG. 3. A time origin (t=0) is treated as an inphase reference; for example, clock 1C0, which undergoes a positive transition at the t=0, is considered inphase. Clock 1C1 lags clock 1C0 by one quarter cycle, clock 1C2 lags clock 1C0 by two quarter cycles, and clock 1C3 lags clock 1C0 by three quarter cycles. Thus, clock 1C2 is the complement of clock 1C0, and clock 1C3 is the complement of clock 1C1. Clock 1C1 is in quadrature relation to inphase clock 1C0; complementary quadrature clock 1C3 is in quadrature relation to complementary inphase clock 1C2. Thus, it can be seen that inphase polarity inverter PII, which is driven by clock 1C0 and its complement clock 1C2, and quadrature polarity inverter PIQ, which is driven by clock 1C1 and its complement clock 1C3, are driven in quadrature relationship to each other.

Distribution switch DSW is driven by 400 MHz clock 2C1 and its complement 2C3. Note that the first upward transition of clock 2C1 occurs one-quarter cycle after the zero phase ($\theta=0°$), while the first upward transition of complementary 400 MHz clock 2C3 occurs three-quarter cycles after zero phase in the timing chart. Finally, 800 MHz clock 4C1 used for duty-cycle equalization has its first upward transition one-quarter of its cycle duration after the zero-phase time t=0. Note that pulses of pulse train P4, FIG. 1, are passed to distribution switch DSW only when clock 4C1 is low so that transistors T6 and T7 are off.

These relative phases are selected so that the transitions of distribution switch DSW occur while duty-cycle equalization switch ESW is dumping signal S2 and so that transitions of each polarity inverter PII, PIQ occur while distribution switch DSW is distributing pulses to the other polarity inverter PIQ, PII. This requires that the polarity inverters be operated in quadrature relative to each other.

Figure 4:
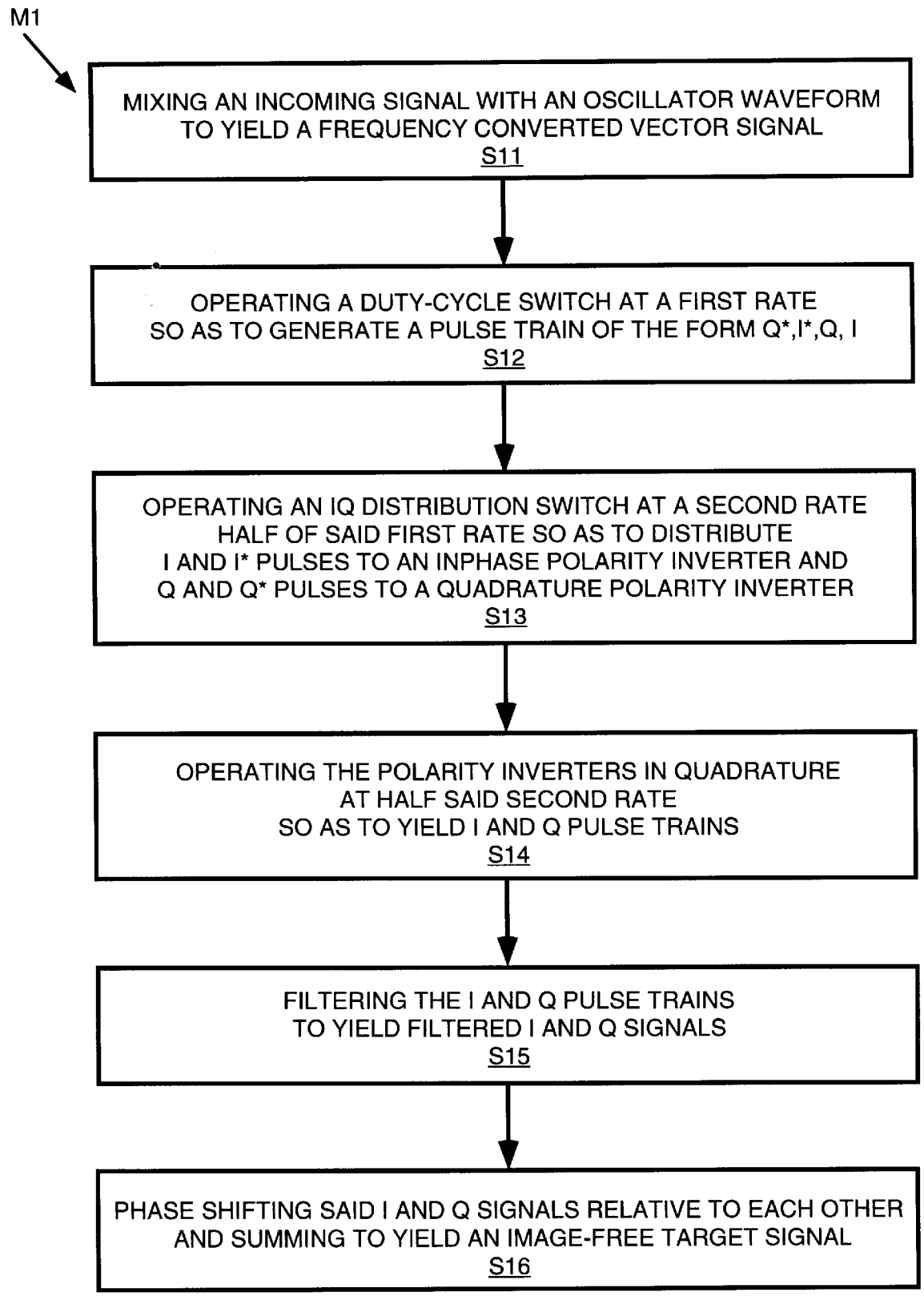
FIG. 4 is a flow chart of a method implemented in the context of the system of FIG. 1.

A method M1 practiced in connection with system AP1 is flow charted in FIG. 4. Step S11 involves mixing an incoming radio frequency signal S1 (including a target carrier signal) with an oscillator waveform to yield frequency-shifted broadband signal S2. Step S12 involves operating duty-equalization switch ESW at a "duty-cycle-equalization" frequency (800 MHz) to convert signal S2 to four-phase pulse train P4. The pulses represent in succession inphase, quadrature, inverse-phase, and inverse-quadrature components of a target carrier signal.

Step S13 involves distributing the inphase and inverse-phase pulses to inphase polarity inverter PII, and the quadrature and inverse-quadrature pulses to quadrature polarity inverter PIQ. This distribution is achieved by operating I-Q distribution switch DSW at a "distribution" frequency (400 MHz) half that of the "duty-cycle-equalization" frequency. Step 14 involves operating polarity inverters PII and PIQ in quadrature with respect to each other and at an "inversion" frequency (200 MHz), half that of said distribution frequency, yielding respective inphase and quadrature pulse trains PI and PQ.

Pulse trains PI and PQ are filtered at step S15 to reject unwanted frequencies and pulse harmonics, thus yielding narrow-band filtered inphase and quadrature signal components. A complex filter can be used to help attenuate image components. Step S16 involves phase shifting and summing so that the target signal components add constructively and the image signal components cancel.

Step S1 can be omitted where an initial frequency conversion is not required. In that case, mixer MIX and oscillator OSC are not used and signal S2 is the system input. Tuning can be omitted or implemented by adjusting the clock rates proportionally. Step S16 can be omitted for I-Q demodulator applications.

As indicated above, in a time-share mixer having parallel polarity inverters downstream of the distribution switch, pulse-to-pulse bleeding results in an equal rotation of I-Q coordinates. Orthogonality of the coordinates is preserved through the rotation to the extent that the modulation imposed on the pulses is constant from pulse to pulse. Of course, since the modulation represents information, the modulation typically changes over time. However, the rate of change of the modulation is typically much slower than the pulse rate, in which case, deviations from orthogonality are negligible. Further improvements in image rejection are in some cases obtainable by minimizing pulse-to-pulse bleeding. This is especially true where the modulation rate is a significant fraction of the pulse rate.

Pulse-to-pulse bleeding can be reduced by discharging any charge accumulated due to the parasitic capacitance at the input of distribution switch DSW. In the illustrated embodiment, duty-cycle equalizer switch ESW couples the input of distribution switch DSW to current dump DMP so that charge accumulated due to parasitic capacitance is discharged.

Proper operation of system AP1 requires that the inputs to polarity inverters PII and PIQ not be coupled to current dump DMP. To this end, while equalization switch ESW is dumping, distribution switch DSW is automatically turned off. The high level of clock 4C1 driving transistors T6 and T7 is sufficiently higher than the high level of clocks 2C1 and 2C3 to keep transistors T8 to T11 off when clock 4C1 is high. Even during the transitions of clock 4C1, when, for a short time, the instantaneous voltage of clock 4C1 is close to the high level of clocks 2C1 and 2C3 (so that transistors T6, T7 are on at the same time as transistors T8, T9 or T10, T11), there is no conductive path from polarity inverters PII and PIQ to dump DMP.

Any current from polarity inverters PII and PIQ to dump DMP must flow through distribution switch DSW comprising transistors T8 to T11 and through duty cycle equalizer switch ESW comprising transistors T6 and T7. Transistors T6 to T11 are kept in saturation, i.e., in unidirectional mode. Current of any direction between polarity inverters PII, PIQ and current dump DMP is blocked either by transistors T8 to T11 or by transistors T6 and T7 due to their back-to-back connection in the current path.

Alternative embodiments use bi-directional elements for the duty-cycle equalization switch and/or the distribution switch. To prevent a direct connection between a polarity inverter input and the current dump, the functions of duty-cycle equalization and the discharge of charge built up due to parasitic capacitance at the distribution switch input are separated. A duty-cycle equalization switch alternately couples and decouples the input signal to and from the downstream signal path as described in the parent patent application. The distribution switch has an intermediate position that couples its input to a current dump while the input signal is decoupled.

Thus, during each transition in either direction between a coupling to the inphase polarity inverter and a coupling to the quadrature polarity inverter is a coupling to the current dump. This coupling of the distribution switch input occurs only while the distribution switch is not coupled to either polarity inverter. All transitions of the distribution switch occur only while the duty cycle equalization switch is decoupling the input signal. At no time is there a connection between the polarity inverter inputs and the current dump.

Alternatively, a separate discharge switch can be employed that couples the distribution switch input to a current dump while the input signal is decoupled and the distribution switch is not coupled to either polarity inverter. Finally, the invention provides for embodiments in which parasitic charge is not dumped. This approach is acceptable because placement of the polarity inverters downstream of the distribution switch preserves I-Q orthogonality despite any rotations of the I and Q axes induced by charge bleeding.

While a particular image-rejecting receiver is described above, alternative receivers with different frequency ranges and different numbers of mixer stages can incorporate the invention. The described time-share I-Q mixer stage serves as a non-tunable mixer; it can be used as a non-tunable receiver without a previous mixer stage. Alternatively, a time-share I-Q mixer in accordance with the invention can be made tunable by using a variable rate clock. The duty-cycle equalization switch can be omitted; in this case the distribution switch both generates and distributes pulses. Note that the time-share mixer stage by itself can be used as an I-Q demodulator. These and other modifications to and variations upon the described embodiments are provided for by the present invention, the scope of which is limited only by the following claims.

What is claimed is:

1. A signal processing system (AP1) for processing a signal including a component with a target carrier having an initial frequency, said system comprising:

an inphase polarity inverter;

a quadrature polarity inverter;

pulse generation and distribution means for converting said signal into an inphase pulse train and a quadrature pulse train and for distributing said pulse trains respectively to said inphase polarity inverter and to said quadrature polarity inverter, said inphase pulse train comprising alternating inphase and inverse-phase pulses, said quadrature pulse train comprising alternating quadrature and inverse-quadrature pulses; and timing means for providing clock signals for driving said polarity inverters so that said inphase polarity inverter inverts said inverse-phase pulses but not said inphase pulses to yield an inphase pulse train and so that said quadrature polarity inverter inverts said inverse-quadrature pulses but not said quadrature pulses to yield a quadrature pulse train, said inphase pulse train representing an inphase component of said target carrier, said quadrature train representing a quadrature component of said target carrier.

2. A signal processing system as recited in claim 1 wherein said timing means drives said polarity inverters in quadrature.

3. A signal processing system as recited in claim 1 wherein said polarity inverters are each comprised of field-effect transistors arranged to provide unity current gain to pulses passing therethrough.

4. A signal processing system as recited in claim 1 further comprising an image attenuator for attenuating image signal components present in said inphase pulse train and in said quadrature pulse train.

5. A signal processing system as recited in claim 1 wherein said pulse generation and distribution means includes:

a duty-cycle equalizer switch for generating a four-phase pulse train of uniformly spaced pulses of equal duration; and a distribution switch for distributing the pulses of said four-phase pulse train in alternation to said inphase and quadrature polarity inverters to yield said inphase pulse train and said quadrature pulse train.

6. A signal processing system as recited in claim 5 in which:

a constant bias is added to said signal so that said four-phase pulse train forms a composite pulse train of uniform polarity, the distribution switch includes unidirectional elements passing a signal only of the same polarity as the polarity of said composite pulse train, and said duty cycle equalizer switch polarizes said unidirectional elements alternately into a passing and blocking state.

7. A signal processing system as recited in claim 5 in which:

the distribution switch includes gateable three terminal elements, and said duty cycle equalizer switch puts said gateable elements alternately into a passing state and a blocking state.

8. A signal processing system as recited in claim 5 in which:

the distribution switch includes a third position where its input is not connected anywhere, the duty cycle equalizer consists of a first switch in series between the source of said signal and the input of the distribution switch alternately passing and blocking the flow of signal, a second switch connecting the input of the distribution switch to a low impedance circuit node discharging the capacitance of the distribution switch input, and said distribution switch and said duty cycle equalizer lead the signal alternately to said inphase and quadrature polarity inverters in the following way:

a. said distribution switch leads to the in-phase polarity inverter, b. said first switch turns nonconductive and blocks the flow of signal, c. said distribution switch goes into its third position, d. said second switch turns conductive and discharges the distribution switch input capacitance, e. said second switch turns nonconductive, f. said distribution switch connects to the quadrature polarity inverter, and g. said first switch becomes conductive and passes the signal.

9. A signal processing method comprising:

generating a four-phase pulse train from an input signal, said four-phase pulse train including inphase, quadrature, inverse-phase, and inverse-quadrature pulses;

distributing pulses in said four-phase pulse train in alternation to define an inverting inphase pulse train composed of said inphase and said inverse phase pulses and an inverting quadrature pulse train composed of said quadrature and said inverse quadrature pulses; and inverting said inverse phase pulses and not said inphase pulses and inverting said inverse quadrature pulses but not said quadrature pulses to define a noninverting inphase pulse train and a noninverting quadrature pulse train.

10. A signal processing method as recited in claim 9 further comprising generation of an inphase timing signal and a quadrature timing signal in quadrature relationship with said inphase timing signal, said inphase timing signal determining the timing of said inverting of said inverse phase pulses and said quadrature timing signal determining the timing of said inverting of said inverse quadrature pulses in said inverting step.

11. A signal processing method as recited in claim 9 further comprising a step of filtering said noninverting inphase and quadrature pulse trains to yield continuous inphase and quadrature signals and for rejecting unwanted frequency components.

12. A signal processing method as recited in claim 9 further comprising a step of attenuating image signal components present in said inphase and quadrature pulse trains.

* * * * *